(12) United States Patent
Lee

(10) Patent No.: US 8,320,163 B2
(45) Date of Patent: Nov. 27, 2012

(54) EIGHT-TRANSISTOR SRAM MEMORY WITH SHARED BIT-LINES

(75) Inventor: Cheng Hung Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 289 days.

(21) Appl. No.: 12/750,430

(22) Filed: Mar. 30, 2010

(65) Prior Publication Data

US 2010/0315859 A1    Dec. 16, 2010

Related U.S. Application Data

(60) Provisional application No. 61/185,891, filed on Jun. 10, 2009.

(51) Int. Cl.
*G11C 11/00* (2006.01)
*G11C 8/16* (2006.01)

(52) U.S. Cl. .................................. 365/154; 365/230.05

(58) Field of Classification Search .................. 365/154, 365/230.05
See application file for complete search history.

(56) References Cited

U.S. PATENT DOCUMENTS

| | | | | |
|---|---|---|---|---|
| 5,828,610 A | * | 10/1998 | Rogers et al. | 365/203 |
| 7,092,279 B1 | * | 8/2006 | Sheppard | 365/154 |
| 7,359,275 B1 | | 4/2008 | Wu | |
| 7,495,948 B2 | * | 2/2009 | Suzuki et al. | 365/154 |
| 7,635,988 B2 | * | 12/2009 | Madurawe | 326/40 |

\* cited by examiner

*Primary Examiner* — Hoai V Ho
*Assistant Examiner* — Tri Hoang
(74) *Attorney, Agent, or Firm* — Slater & Matsil, L.L.P.

(57) ABSTRACT

An integrated circuit structure includes a first static random access memory (SRAM) cell including a first read-port and a first write-port; and a second SRAM cell including a second read-port and a second write-port. The first SRAM cell and the second SRAM cell are in a same row and arranged along a row direction. A first word-line is coupled to the first SRAM cell. A second word-line is coupled to the second SRAM cell. A read bit-line is coupled to the first SRAM cell and the second SRAM cell, wherein the read bit-line extends in a column direction perpendicular to the row direction. A write bit-line is coupled to the first SRAM cell and the second SRAM cell.

16 Claims, 5 Drawing Sheets

EIGHT-TRANSISTOR SRAM MEMORY WITH SHARED BIT-LINES This application claims the benefit of U.S. Provisional Application No. 61/185,891 filed on Jun. 10, 2009, entitled "Eight-Transistor SRAM Memory with Shared Bit-Lines," which application is hereby incorporated herein by reference.

TECHNICAL FIELD

This invention relates generally to integrated circuit design, and more particularly to the design of dual-port static random access memories (SRAMs).

BACKGROUND

Static random access memory (SRAM) is commonly used in integrated circuits. SRAM cells have the advantageous feature of holding data without a need for refreshing. SRAM cells may include different numbers of transistors, and are often referred to by the number of transistors, for example, six-transistor (6T) SRAM, eight-transistor (8T) SRAM, and the like. The transistors typically form a data latch for storing a bit. Additional transistors may be added to control the access to the transistors. SRAM cells are typically arranged as an array having rows and columns. Each row of the SRAM cells is connected to a word-line, which determines whether an SRAM cell is selected or not. Each column of the SRAM cells is connected to a bit-line (or a pair of complementary bit-lines), which is used for storing a bit read into, or read from, the SRAM cell.

When integrated on system-on-chip (SOC) applications, the conventional SRAM cells face the increasing demanding requirement of reducing power consumption and increasing speed. However, in conventional 6T memories, the reduction of power consumption requires the operation voltage to be reduced. This results in a cell stability concern, which is caused by reduced Vcc_min, and hence reduced static noise margin (SNM).

To solve these problems, 8T SRAM cells have been explored. FIG. 1 illustrates a conventional 8T dual-port transistor, which includes a latch including PMOS transistor 2 110 and 112 and NMOS transistors 114 and 116. Pass-gate transistors 118 and 120 are controlled by write word-line WWL and act as write-port pass-gate transistors. Write-lines WBL and WBLB are used for writing data into the SRAM cell. Transistors 122 and 124 form the read-port of the SRAM cell, wherein pass-gate transistor 124 is controlled by read word-line RWL. Read-line RBL is used for reading data from the SRAM cell.

The 8T SRAM cell as shown in FIG. 1 is well suited for use in the case the multiplexing ratio (indicating how many columns share a multiplexer) is equal to 1. In this case, no multiplexing of columns is performed, and the 8T SRAM cell may have reduced static noise margin (SNM) and low Vcc_min without affecting the stability of the 8T SRAM cell. However, if the multiplexing ratio is greater than 1, and hence more than one column shares a multiplexer, the 8T SRAM cell has to trade off between write-read margin (WRM) and SNM, and the reduction of Vcc_min is limited.

Conventionally, to solve the possible 8T SRAM cell instability problem caused by reduced Vcc_min in dummy read operations, write-back technologies have been used, in which the values stored in the SRAM cells experiencing dummy read are read from and written back into the cells to ensure the stability of the stored value. However, this requires additional circuits, and the chip area penalty is high.

SUMMARY OF THE INVENTION

In accordance with one aspect of the present invention, an integrated circuit structure includes a first static random access memory (SRAM) cell including a first read-port and a first write-port; and a second SRAM cell including a second read-port and a second write-port. The first SRAM cell and the second SRAM cell are in a same row and are arranged along a row direction. A first word-line is coupled to the first SRAM cell. A second word-line is coupled to the second SRAM cell. A read bit-line is coupled to the first SRAM cell and the second SRAM cell, wherein the read bit-line extends in a column direction perpendicular to the row direction. A write bit-line is coupled to the first SRAM cell and the second SRAM cell.

Other embodiments are also disclosed.

The advantageous features of the present invention include reduced chip area usage due to the sharing of bit-lines between neighboring columns, and improved Vcc_min due to the use of dual-port SRAM cells.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

A novel eight-transistor (8T) dual-port static random access memory (SRAM) in accordance with an embodiment is provided. The variations and the operation of the embodiment are discussed. Throughout the various views and illustrative embodiments of the present invention, like reference numbers are used to designate like elements. Although 8T transistors are used as examples, in accordance with embodiments of the present invention, more transistors may be added to SRAM cells.

Figure 1:
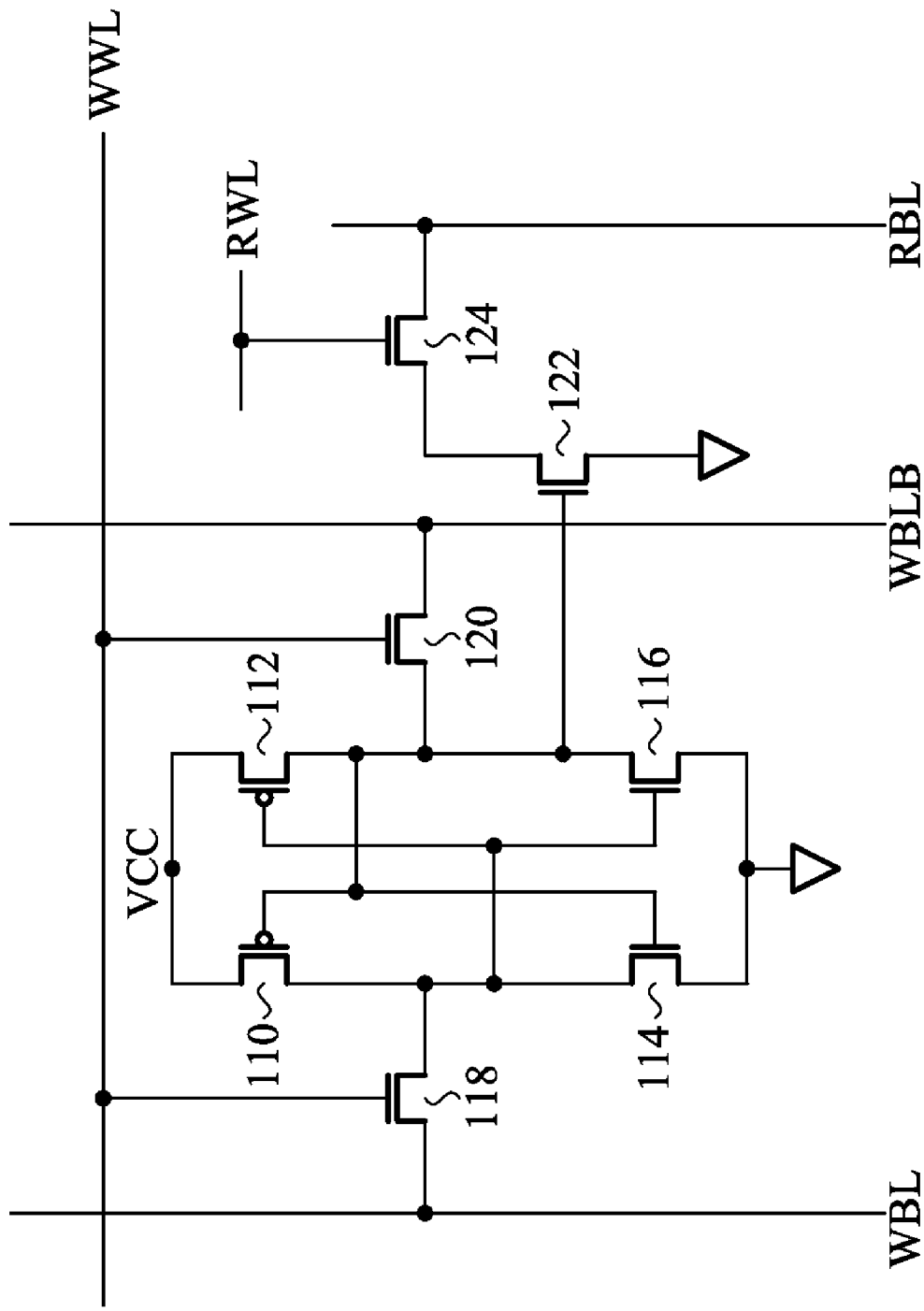
FIG. 1 illustrates a conventional eight-transistor (8T) dual-port static random access memory (SRAM) cell.
Figure 2:
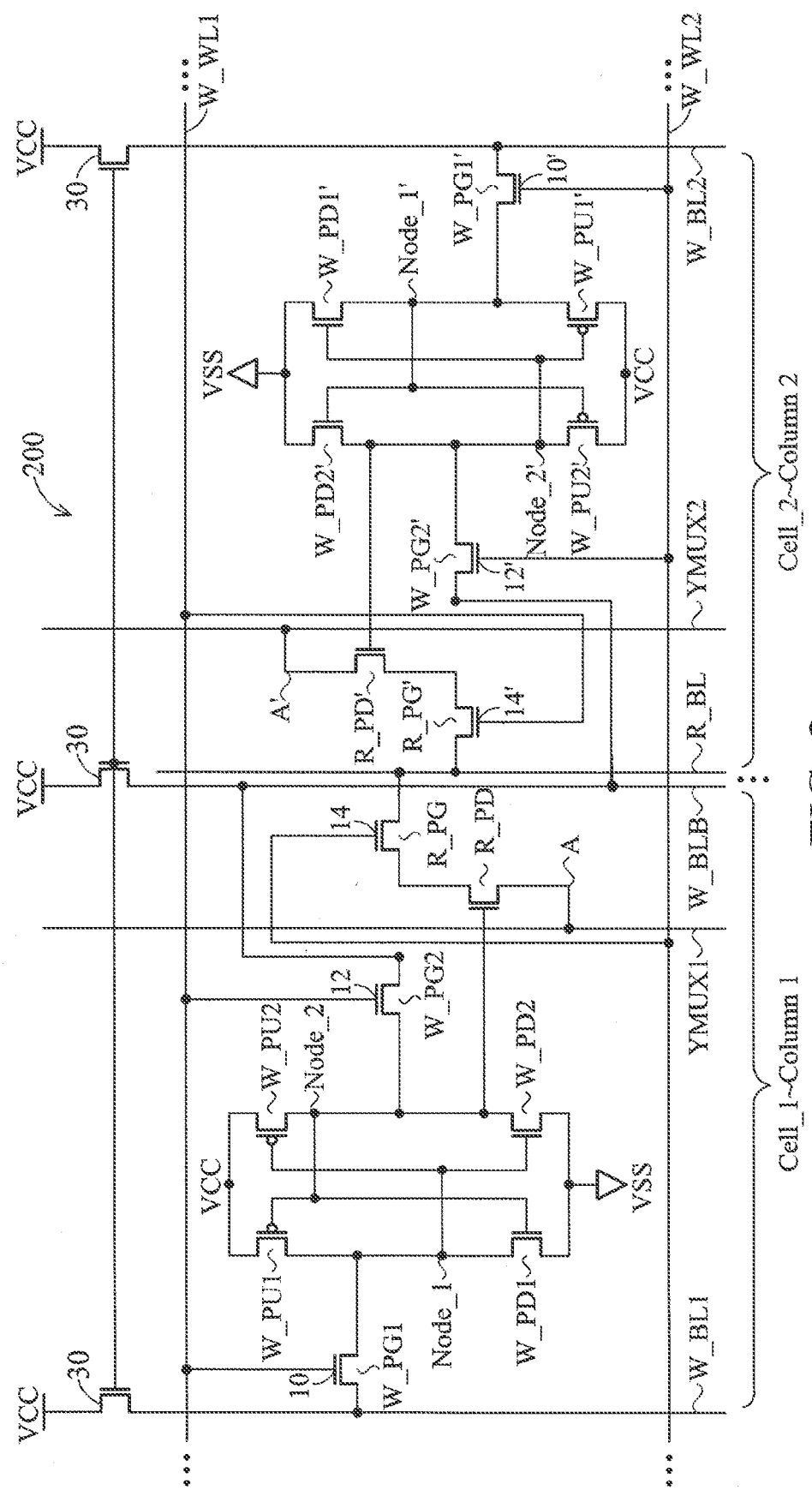
FIG. 2 illustrates two SRAM cells in a same row and sharing bit-lines in accordance with an embodiment, wherein two word-lines are connected to each row.

FIG. 2 illustrates an embodiment, which includes 8T SRAM cell Cell_1 and Cell_2. SRAM cells Cell_1 and Cell_2 are in a same row and in neighboring columns of SRAM array 200, which is formed of a plurality of rows and a plurality of columns. In the following discussions, the detailed structure of SRAM Cell_1 is described. SRAM Cell_2 has an identical structure as SRAM Cell_1, except it is illustrated as rotated by 180 degrees and may be connected to word-lines in different ways. The features in SRAM cell Cell_2 are denoted using the same notation as the corresponding features in SRAM cell Cell_1 followed by an apostrophe ("'").

SRAM cell Cell_1 includes pull-up transistors W_PU1 and W_PU2, pull-down transistors W_PD1 and W_PD2, and pass-gate transistors W_PG1 and W_PG2. The drains of pull-up transistor W_PU1 and pull-down transistor W_PD1 are interconnected, and the drains of pull-up transistor W_PU2 and pull-down transistor W_PD2 are interconnected. Transistors W_PU1, W_PU2, W_PD1, and W_PD2 are cross-coupled to form a data latch. Pass-gate transistor W_PG1 has a source/drain region (an output) connected to bit-line W_BL1 and a source/drain region connected to storage node Node_1, while pass-gate transistor W_PG2 has a source/drain region (an output) connected to bit-line W_BLB and a source/drain region connected to storage node Node_2. Storage nodes Node_1 and Node_2 are complementary nodes that are often at opposite logic levels (logic high or logic low). Gates 10 and 12 of pass-gate transistors W_PG1 and W_PG2 are connected to word-line W_WL1. SRAM cell Cell_1 is coupled between positive operation voltage VCC and operation voltage VSS that is lower than voltage VCC.

Transistors W_PU1, W_PU2, W_PD1, W_PD2, W_PG1, and W_PG2 (referred to as write-port transistors hereinafter) form the write-ports of SRAM cell Cell_1, wherein transistors W_PG1, W_PU1, and W_PD1 form a first half write-port, and transistors W_PG2, W_PU2, and W_PD2 form a second half write-port. The write-ports are used for writing data into SRAM cell Cell_1. The reading of the data stored in SRAM cell Cell_1 is performed through read pull-down transistor R_PD and read-port pass-gate transistor R_PG. Gate 14 of read-port pass-gate transistor R_PG is connected to word-line W_WL2, which is electrically and physically separated from word-line W_WL1. A source/drain region (an output) of read-port pass-gate transistor R_PG is connected to read bit-line R_BL. When write operations are performed, read-port pass-gate transistor R_PG is turned off by turning off (applying a logic low signal to) word-line W_WL2, while write-port pass-gate transistors W_PG1 and W_PG2 are turned on by turning on (applying a logic high signal to) word-line W_WL1. The data are thus written into SRAM cell Cell_1 through write bit-lines W_BL1 and W_BLB. Conversely, when read operations are performed, write-port pass-gate transistors W_PG1 and W_PG2 are turned off by turning off word-line W_WL1, while read-port pass-gate transistor R_PG is turned on by turning on word-line W_WL2. Read pull-down transistor R_PD has one source/drain region (connected to node A) connected to a source/drain region of read-port pass-gate transistor R_PG, and another source/drain region connected to a Y-direction multiplex line YMUX1. Y-direction multiplex line YMUX1 may be connected to the source/drain of all read pull-down transistors R_PD in a same column. In alternative embodiments, instead of being connected to Y-direction multiplex line YMUX1, node A may be connected to VSS.

SRAM cell Cell_2 may have an identical structure as SRAM cell Cell_1, and may include pull-up transistors W_PU1' and W_PU2', pull-down transistors W_PD1' and W_PD2', pass-gate transistors W_PG1' and W_PG2', read pull-down transistor R_PD', and read-port pass-gate transistor R_PG'. Different from the word-line connection of SRAM cell Cell_1, gate 10' of write-port pass-gate transistor W_PG1' and gate 12' of write-port pass-gate transistor W_PG2' are connected to word-line W_WL2. Gate 14' of read-port pass-gate transistor R_PG' is connected to word-line W_WL1. In other words, SRAM cell Cell_1 uses word-line W_WL1 as a write word-line, and word-line W_WL2 as a read word-line, while conversely, SRAM cell Cell_2 uses word-line W_WL2 as a write word-line, and word-line W_WL1 as a read word-line. Read pull-down transistor R_PD' has one source/drain region connected to a source/drain region (connected to node A') of read-port pass-gate transistor R_PG', and another source/drain region connected to a Y-direction multiplex line YMUX2. Y-direction multiplex line YMUX2 may be connected to the source/drain of all read pull-down transistors R_PD' in a same column. In alternative embodiments, instead of being connected to Y-direction multiplex line YMUX2, node A' may be connected to VSS.

When a write operation is performed to SRAM cell Cell_1, word-line W_WL1 is turned on and word-line W_WL2 is turned off, and hence SRAM cell Cell_2 will not be written into, and vice versa. Also, when a read operation is performed to SRAM cell Cell_1, word-line W_WL2 is turned on and word-line W_WL1 is turned off, and hence SRAM cell Cell_2 will not be read from, and vice versa. This makes the sharing of bit-lines possible. Read bit-line R_BL is shared by SRAM cells Cell_1 and Cell_2, and also by all SRAM cells in column 1 and column 2 of SRAM array 200. Accordingly, this embodiment has a multiplexing ratio equal to 2, which means that each pair of neighboring columns shares a multiplexer, and only one column in a pair of neighboring columns is read from at a time. In addition, write bit-line W_BLB is shared by SRAM cells Cell_1 and Cell_2, and by all SRAM cells in column 1 and column 2 of SRAM array 200. It is realized that write bit-lines W_BL (either W_BL1 or W_BL2) and W_BLB may be referred to interchangeably.

Although not shown in FIG. 2 (refer to FIG. 3, for example, assuming B is 0), there may be a column on the left of column 1, and hence write bit-line W_BL1 is shared by column 1 and the column on the left of column 1. In other words, on average, column 1 only uses one-half of write bit-line W_BL1. Similarly, there may be a column on the right of column 2, and hence write bit-line W_BL2 is shared by column 2 and the column on the right of column 2. In other words, on average, column 2 only uses one-half of write bit-line W_BL2. As a result, columns 1 and 2 on average only use one write bit-line W_BL (one-half of write bit-line W_BL1 and one-half of write bit-line W_BL2). In SRAM array 200, a total number of read bit-lines is equal to one-half of the total number of all columns in SRAM array 200, and a total number of all differential pairs of write bit-lines is equal to about (since the total number of write bit-lines W_BL1 and W_BL2 may be equal to the number of columns plus 1) one-half of the total number of all columns in SRAM array 200. Columns 1 and 2 thus share both read bit-line R_BL and write bit-lines W_BL (either W_BL1 or W_BL2) and W_BLB. Accordingly, the chip area required for laying out bit-lines is effectively reduced by one-half, and the chip area usage of memory array 200 may be reduced.

Since SRAM cells Cell_1 and Cell_2 share word-lines W_WL1 and W_WL2, when one of SRAM cells Cell_1 and Cell_2 is read from, the other one of SRAM cells Cell_1 and Cell_2 experiences dummy read. For example, when SRAM cell Cell_1 is read from, SRAM cell Cell_2 may be unstable if its static noise margin (SNM) is low. This problem may be reduced by using NMOS transistors 30, instead of PMOS transistors, to pre-charge write bit-lines W_BLB and W_BL1/W_BL2. It is observed that by using NMOS transistors 30, the voltage on write bit-lines W_BLB and W_BL1/

W_BL2 is (VCC−Vt), wherein Vt is the threshold of NMOS transistors 30. The stability of the SRAM cells is hence improved. As a comparison, if PMOS transistors are used to control the pre-charge, the voltages on write bit-lines W_BLB and W_BL1/W_BL2 will be VCC, and hence cells Cell_1 and Cell_2 will be less stable.

Figure 3:
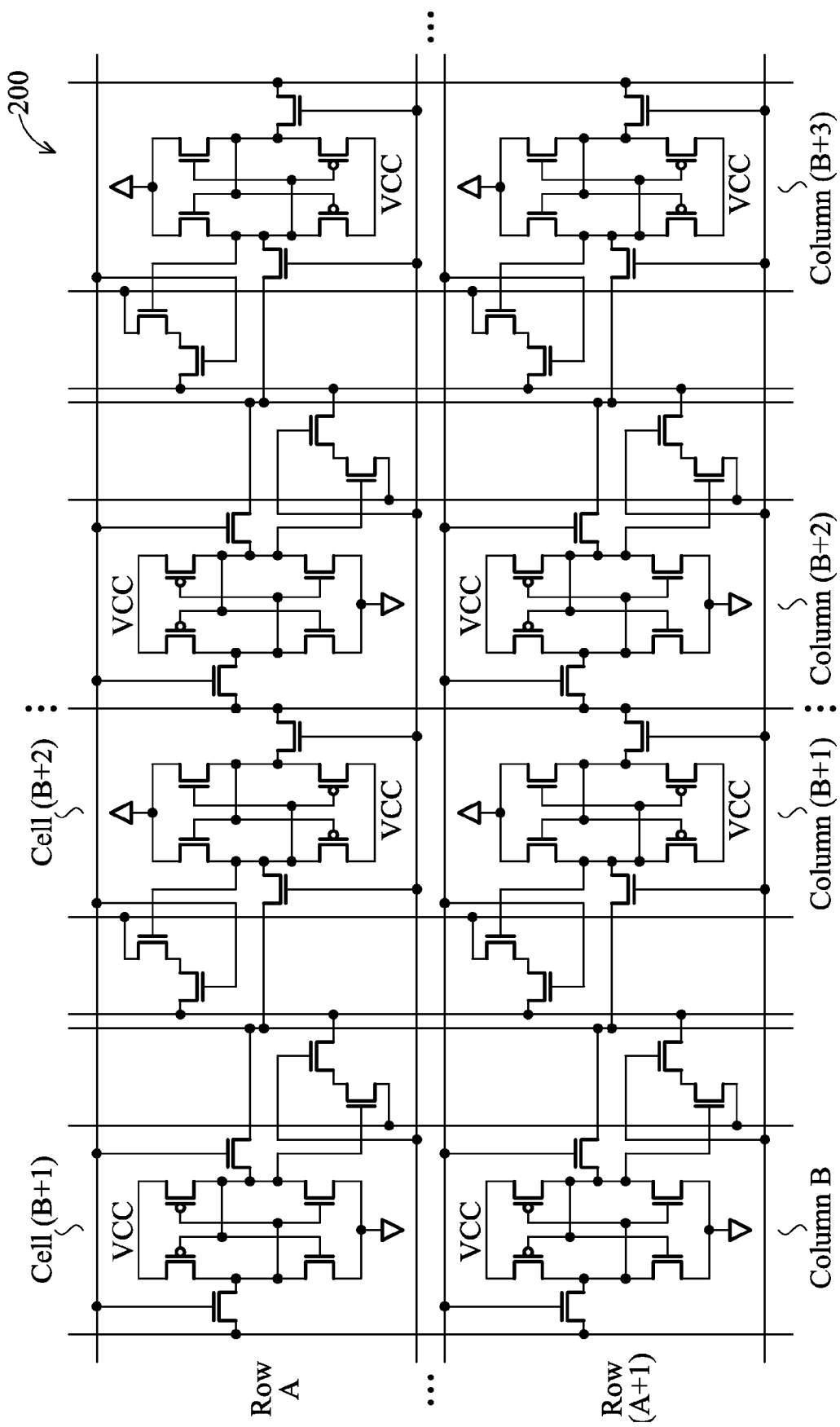
FIG. 3 illustrates a portion of an SRAM array.

FIG. 3 illustrates more devices in SRAM array 200, wherein two neighboring rows A and (A+1) and four neighboring columns B through (B+3) are illustrated. It is noted that two neighboring cells in a same column, for example, SRAM cells Cell_(B+1) and Cell_(B+2) have the same structures as those shown in FIG. 2. Additional portions of SRAM array 200 may be added by repeating the drawing shown in FIG. 3, and by applying the teaching provided in preceding paragraphs.

Figure 4:
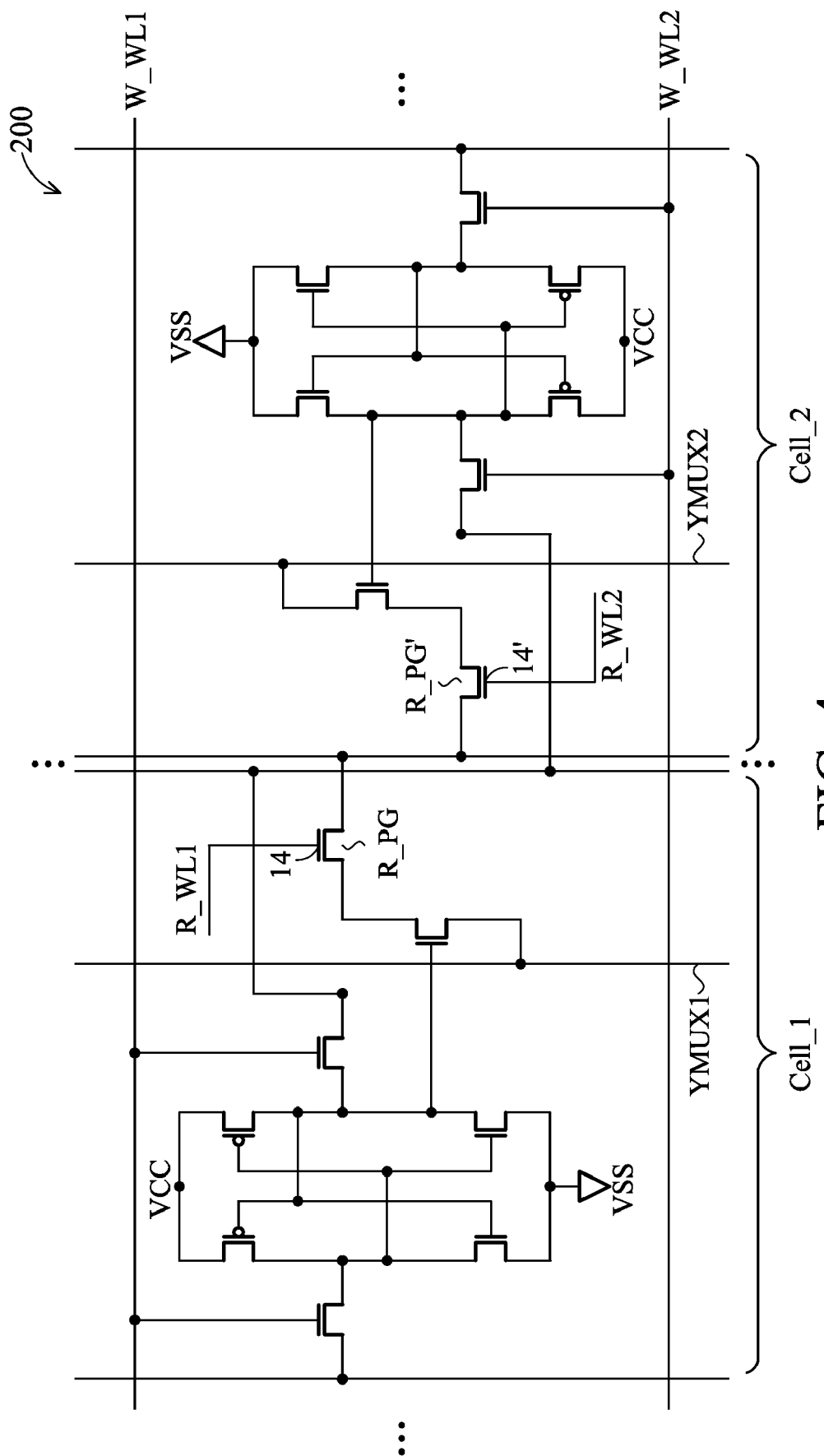
FIG. 4 illustrates two SRAM cells sharing bit-lines in accordance with another embodiment, wherein four word-lines are connected to each row.

FIG. 4 illustrates an alternative embodiment. In this embodiment, gate 14 of read-port pass-gate transistor R_PG is connected to read word-line R_WL1, while gate 14' of read-port pass-gate transistor R_PG' is connected to read word-line R_WL2 separate from word-lines R_WL1, W_WL1, and W_WL2. This embodiment, although having the overhead of additional word-lines, can have further improved Vcc_min since dummy read is less likely to occur to any of SRAM cells Cell_1 and Cell_2, and any of the other cells in SRAM array 200. In this embodiment, the pre-charge to write bit-lines W_BLB and W_BL1/W_BL2 may be performed using NMOS transistors as shown in FIG. 2, or by replacing the NMOS transistors in FIG. 2 with PMOS transistors. Again, the structure as shown in FIG. 4 may be repeated to form an array similar to the array shown in FIG. 3, except that each row of the array is connected to four word-lines, R_WL1, R_WL2, W_WL1, and W_WL2.

Figure 5:
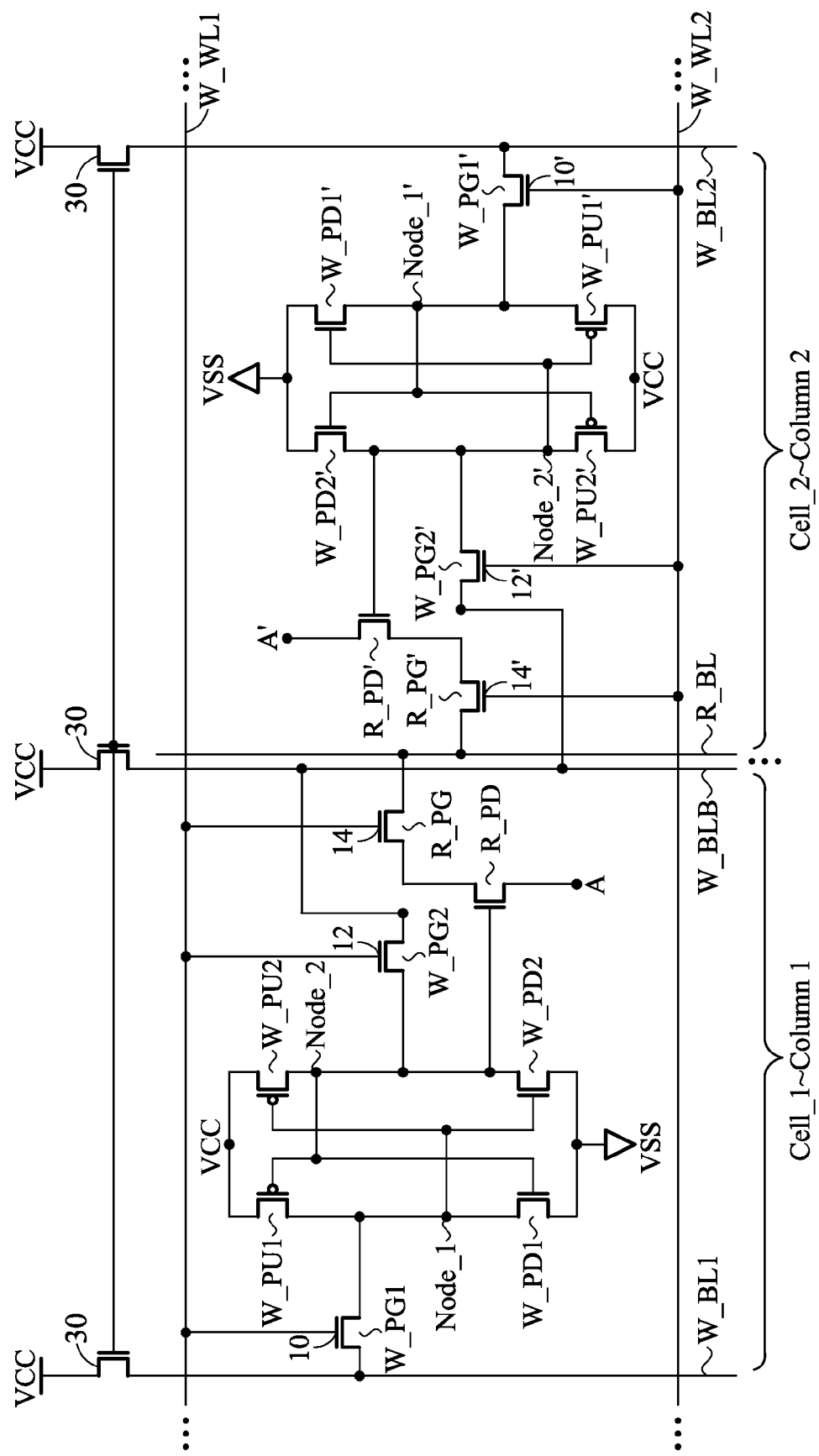
FIG. 5 illustrates two SRAM cells in a same row and sharing bit-lines in accordance with an embodiment, wherein gates of pass-gate gate transistors in a same cell are connected to a same word-line.

FIG. 5 illustrates yet another embodiment. This embodiment is similar to the embodiment shown in FIG. 2, except that that the gate of read-port pass-gate transistor R_PG is connected to word-line W_WL1, while the gate of read-port pass-gate transistor R_PG' is connected to word-line W_WL2. Again, a source/drain region (marked as node A) of read pull-down transistor R_PD may be connected to a Y-direction multiplex line (refer to FIG. 2) or VSS, and a source/drain region (marked as node A') of read pull-down transistors R_PD' may be connected to a Y-direction multiplex line (refer to FIG. 2) or VSS. Again, bit-lines W_BL1, W_BL2, and W_BLB are connected to, and pre-charged by, NMOS devices 30, although they may also be connected to, and pre-charged by, PMOS devices.

The embodiments of the present invention have several advantageous features. By sharing bit-lines between neighboring columns, the chip area usage of SRAM cells is reduced. However, the benefits of improved Vcc_min and improved SNM, which are the benefits of 8T dual-gate SRAM cells, are still maintained.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
    a first static random access memory (SRAM) cell comprising a first read-port and a first write-port;
    a second SRAM cell comprising a second read-port and a second write-port, wherein the first SRAM cell and the second SRAM cell are in a same row and are arranged along a row direction;
    a first word-line coupled to the first SRAM cell;
    a second word-line coupled to the second SRAM cell;
    a read bit-line coupled to the first SRAM cell and the second SRAM cell, wherein the read bit-line extends in a column direction perpendicular to the row direction; and
    a write bit-line coupled to the first SRAM cell and the second SRAM cell, wherein each of the first SRAM cell and the second SRAM cell comprises:
        a write-port pass-gate transistor; and
        a read-port pass-gate transistor, wherein the read-port pass-gate transistor of the first SRAM cell and the write-port pass-gate transistor of the second SRAM cell are connected to the first word-line, and wherein the read-port pass-gate transistor of the second SRAM cell and the write-port pass-gate transistor of the first SRAM cell are connected to the second word-line.

2. The integrated circuit structure of claim 1, wherein the first SRAM cell and the second SRAM cell are eight-transistor SRAM cells.

3. The integrated circuit structure of claim 1 further comprising:
    a positive power supply node having a positive power supply voltage;
    a first n-type metal-oxide-semiconductor (NMOS) transistor having a source-to-drain path serially connected between the positive power supply node and the read bit-line; and
    a second NMOS transistor having a source-to-drain path serially connected between the positive power supply node and the write bit-line.

4. The integrated circuit structure of claim 1, wherein the first SRAM cell and the second SRAM cell comprise a portion of an SRAM array comprising rows and columns, and wherein a total number of all read bit-lines in the SRAM array is equal to one-half a total number of the columns in the SRAM array.

5. The integrated circuit structure of claim 1, wherein the first SRAM cell and the second SRAM cell are a portion of an SRAM array comprising rows and columns, and wherein a total number of all differential pairs of write bit-lines in the SRAM array is equal to about one-half a total number of the columns.

6. An integrated circuit structure comprising:
    a first static random access memory (SRAM) cell comprising:
        a first read-port comprising a first read-port pass-gate transistor; and
        a first write-port comprising a first write-port pass-gate transistor;
    a second SRAM cell comprising:

a second read-port comprising a second read-port pass-gate transistor; and
a second write-port comprising a second write-port pass-gate transistor;
a first word-line coupled to a gate of the first read-port pass-gate transistor and a gate of the second write-port pass-gate transistor;
a second word-line coupled to a gate of the second read-port pass-gate transistor and a gate of the first write-port pass-gate transistor;
a read bit-line connected to a source/drain region of the first read-port pass-gate transistor and a source/drain region of the second read-port pass-gate transistor;
a first write bit-line connected to a source/drain region of the first write-port pass-gate transistor and a source/drain region of the second write-port pass-gate transistor;
a positive power supply node having a positive power supply voltage;
a first n-type metal-oxide-semiconductor (NMOS) transistor having a source-to-drain path serially connected between the positive power supply node and the read bit-line; and
a second NMOS transistor having a source-to-drain path serially coupled between the positive power supply node and the first write bit-line.

7. The integrated circuit structure of claim 6 further comprising:
a second write bit-line connected to a source/drain region of a second write-port pass-gate transistor of the first SRAM cell; and
a third write bit-line connected to a source/drain region of a second write-port pass-gate transistor of the second SRAM cell, wherein the first write bit-line, the second write bit-line, and the third write bit-line are separate lines.

8. The integrated circuit structure of claim 7, wherein the second write bit-line is shared by the first SRAM cell and a third SRAM cell on an opposite side of the first SRAM cell than the second SRAM cell, and wherein the first write bit-line is not shared by the third SRAM cell.

9. The integrated circuit structure of claim 6, wherein the first SRAM cell and the second SRAM cell are a portion of an SRAM array, and wherein a total number of all read bit-lines in the SRAM array is equal to one-half a total number of all columns in the SRAM array.

10. The integrated circuit structure of claim 6, wherein the first SRAM cell and the second SRAM cell are a portion of an SRAM array, and wherein a total number of all differential pairs of write bit-lines in the SRAM array is equal to about one-half a total number of all columns in the SRAM array.

11. The integrated circuit structure of claim 10 wherein the first SRAM cell further comprises a first read pull-down transistor comprising a source/drain region connected to an additional source/drain region of the first read-port pass-gate transistor, the second SRAM cell further comprises a second read pull-down transistor comprising a source/drain region connected to an additional source/drain region of the second read-port pass-gate transistor, and wherein the integrated circuit structure further comprises:
a first Y-direction multiplex line connected to an additional source/drain region of the first read pull-down transistor; and
a second Y-direction multiplex line connected to an additional source/drain region of the second read pull-down transistor.

12. An integrated circuit structure comprising:
a first static random access memory (SRAM) cell comprising a first read-port and a first write-port;
a second SRAM cell comprising a second read-port and a second write-port;
a first write word-line coupled to, and configured to control, the first write-port;
a second write word-line coupled to, and configured to control, the second write-port;
a first read word-line coupled to, and configured to control, the first read-port;
a second read word-line coupled to, and configured to control, the second read-port; and
a read bit-line connected to an output of the first read-port and an output of the second read-port, wherein the first SRAM cell and the second SRAM cell comprise a portion of an SRAM array comprising rows and columns, and wherein a total number of all read bit-lines in the SRAM array is substantially equal to one-half a total number of all columns in the SRAM array.

13. The integrated circuit structure of claim 12 further comprising a first write bit-line coupled to an output of the first write-port and an output of the second write-port.

14. The integrated circuit structure of claim 13, wherein the first SRAM cell comprises a third write-port, the second SRAM cell comprises a fourth write-port, and wherein the integrated circuit further comprises:
a second write bit-line connected to an output of the third write-port; and
a third write bit-line connected to an output of the fourth write-port, wherein the first write bit-line, the second write bit-line, and the third write bit-line are separate lines.

15. The integrated circuit structure of claim 14, wherein the second write bit-line is shared by the first SRAM cell and a third SRAM cell, wherein the second SRAM cell and the third SRAM cell are on opposite sides of the first SRAM cell, and wherein the first write bit-line is not shared by the third SRAM cell.

16. The integrated circuit structure of claim 12, wherein each of the first SRAM cell and the second SRAM cell comprises eight transistors.

* * * * *